United States Patent
Noffsinger et al.

(10) Patent No.: US 9,845,023 B2
(45) Date of Patent: *Dec. 19, 2017

(54) ROUTE FEATURE IDENTIFICATION SYSTEM AND METHOD

(71) Applicant: General Electric Company, Schenectady, NY (US)

(72) Inventors: Joseph Forrest Noffsinger, Lee's Summit, MO (US); Jeffrey Michael Fries, Lee's Summit, MO (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/295,300

(22) Filed: Oct. 17, 2016

(65) Prior Publication Data

US 2017/0043678 A1 Feb. 16, 2017

Related U.S. Application Data

(63) Continuation of application No. 14/685,751, filed on Apr. 14, 2015, now Pat. No. 9,469,320.

(Continued)

(51) Int. Cl.
| | |
|---|---|
| *G05D 1/00* | (2006.01) |
| *G05D 3/00* | (2006.01) |
| *G06F 7/00* | (2006.01) |
| *G06F 17/00* | (2006.01) |
| *B60M 1/02* | (2006.01) |
| *B61L 23/04* | (2006.01) |
| *B61L 3/10* | (2006.01) |
| *B61L 25/02* | (2006.01) |
| *B60L 1/00* | (2006.01) |
| *B60L 3/12* | (2006.01) |

(Continued)

(52) U.S. Cl.
CPC ............... *B60M 1/02* (2013.01); *B60L 1/00* (2013.01); *B60L 3/12* (2013.01); *B60M 1/30* (2013.01); *B61L 3/10* (2013.01); *B61L 23/041* (2013.01); *B61L 23/044* (2013.01); *B61L 25/023* (2013.01); *B61L 25/025* (2013.01);
(Continued)

(58) Field of Classification Search
CPC ... B60L 3/12; B60L 3/10; B60M 1/02; B60M 1/30; B61L 25/025; B61L 25/023; B61L 25/02

See application file for complete search history.

(56) References Cited

U.S. PATENT DOCUMENTS

| | | | | |
|---|---|---|---|---|
| 6,195,020 B1 * | 2/2001 | Brodeur, Sr. | ........... | B61L 29/22 246/125 |
| 6,262,573 B1 * | 7/2001 | Wojnarowski | ........... | B61K 9/10 324/217 |
| 6,360,998 B1 * | 3/2002 | Halvorson | ................ | B61L 3/06 246/122 R |

(Continued)

*Primary Examiner* — Rachid Bendidi
(74) *Attorney, Agent, or Firm* — Global Patent Operation; John A. Kramer

(57) ABSTRACT

A system includes at least one application device, a control unit, and at least one processor. The at least one application device is conductively or inductively coupled with at least one of a first conductive track or a second conductive track. The control unit is configured to control supply of electric current from a power source to the at least one application device to electrically inject at least one examination signal into the conductive tracks. The at least one processor is configured to monitor the one or more electrical characteristics of at least one of the first or second conductive tracks, and to identify a construction feature of the route based on the one or more electrical characteristics, wherein the construction feature corresponds to a man-made aspect of the route.

14 Claims, 6 Drawing Sheets

Related U.S. Application Data

(60) Provisional application No. 61/985,088, filed on Apr. 28, 2014.

(51) Int. Cl.
    *B60M 1/30*         (2006.01)
    *G01R 31/08*       (2006.01)
    *B61L 29/28*       (2006.01)

(52) U.S. Cl.
    CPC ............ *G01R 31/086* (2013.01); *B61L 25/02* (2013.01); *B61L 29/284* (2013.01); *B61L 29/286* (2013.01)

(56) References Cited

U.S. PATENT DOCUMENTS

| | | | | |
|---|---|---|---|---|
| 6,377,215 B1 * | 4/2002 | Halvorson | ............ | B61L 25/021 105/168 |
| 6,533,223 B1 * | 3/2003 | Ireland | ............ | A63H 19/24 246/122 A |
| 7,188,009 B2 * | 3/2007 | Hawthorne | ............ | B61L 3/004 246/15 |
| 8,305,567 B2 * | 11/2012 | Hesser | ............ | E01B 35/00 356/237.1 |
| 2001/0019263 A1 * | 9/2001 | Kwun | ............ | G01N 29/11 324/217 |
| 2002/0091483 A1 * | 7/2002 | Douet | ............ | B61L 23/34 701/408 |
| 2003/0038216 A1 * | 2/2003 | Holgate | ............ | B61L 23/044 246/122 R |
| 2008/0105791 A1 * | 5/2008 | Karg | ............ | B61K 9/10 246/120 |
| 2013/0062474 A1 * | 3/2013 | Baldwin | ............ | B61L 29/282 246/122 R |
| 2013/0261856 A1 * | 10/2013 | Sharma | ............ | B61L 25/025 701/19 |

* cited by examiner

ROUTE FEATURE IDENTIFICATION SYSTEM AND METHOD

CROSS-REFERENCE TO RELATED APPLICATIONS

This application is a continuation of U.S. application Ser. No. 14/685,751, filed 14 Apr. 2015 and to be issued as U.S. Pat. No. 9,469,320 on 18 Oct. 2016, which claims priority to U.S. Provisional Application No. 61/985,088, which was filed 28 Apr. 2014 (the "088 application"). The entire disclosures of the application Ser. No. 14/685,751 and 61/985,088 are incorporated by reference. This application is related to U.S. patent application Ser. No. 14/016,310, which was filed 5 Sep. 2013 and claims priority to U.S. Provisional Application No. 61/729,188, which was filed on 21 Nov. 2012. The entire disclosures of the application Ser. No. 14/016,310 and 61/729,188 are incorporated by reference.

TECHNICAL FIELD

Embodiments of the subject matter disclosed herein relate to examining routes traveled by vehicles, for example to identify features of a route passed over by a vehicle.

BACKGROUND

As vehicles, such as rail vehicles, traverse a route, it may be desirable to know the position of a vehicle, for example, for scheduling or dispatching purposes, or to help prevent the use of the same portion of the route by two or more vehicles at the same time (e.g., to avoid collisions). Conventional approaches, for example, that may use a geographic positioning system (GPS), may not provide sufficient accuracy to discriminate between two or more adjacent tracks. To determine which of parallel or near parallel tracks on which a vehicle is traveling, additional inputs may be required, for example a position of a switch when the vehicle passes over the switch. However, conventional approaches for communicating the position of a switch to the vehicle or identifying the position of a switch require expensive trackside equipment to monitor the switch position and to communicate the switch position to the rail vehicle.

BRIEF DESCRIPTION

In an embodiment, a system includes at least one application device, a control unit, and at least one processor. The at least one application device is configured to be at least one of conductively or inductively coupled with at least one of a first conductive track or a second conductive track of a route being traveled by a vehicle. The control unit is configured to control supply of electric current from a power source to the at least one application device to electrically inject at least one examination signal into the conductive tracks via the at least one application device. The at least one processor configured to be disposed onboard the vehicle. The at least one processor configured to monitor one or more electrical characteristics of at least one of the first or second conductive tracks in response to the at least one examination signal being injected into the conductive tracks, and to identify a construction feature of the route based on an examination of the one or more electrical characteristics, the construction feature corresponding to a man-made aspect of the route.

In another embodiment, a system includes a first application device, a second application device, a control unit, and at least one processor. The first application device and the second application device are configured to be at least one of conductively or inductively coupled with at least one of a first conductive track or a second conductive track of a route being traveled by a vehicle. The control unit is configured to control supply of electric current from a power source to the first and second application devices to electrically inject a first examination signal via the first application device and a second examination signal via the second application device into the conductive tracks. The first and second examination signals include respective unique identifiers. The at least one processor is configured to be disposed onboard the vehicle. The at least one processor is configured to monitor one or more electrical characteristics of at least one of the first or second conductive tracks in response to the first and second examination signals being injected into the conductive tracks; to identify a construction feature of the route based on an examination of the one or more electrical characteristics, wherein the construction feature corresponding to at least one of a switch, a diamond crossing, or a bridge; to determine a location of the vehicle based on the construction feature; and to control at least one device onboard the vehicle based on the location that is determined.

In another embodiment, a method includes injecting, via at least one application device disposed upon a vehicle, at least one examination signal into at least one of first or second conductive tracks of a route being traveled by the vehicle. The method also includes monitoring, via at least one detection device disposed upon the vehicle, one or more electrical characteristics of at least one of the first or second conductive tracks in response to the at least one examination signal being injected into the at least one of the first or second conductive tracks. Also, the method includes identifying a construction feature of the route based on the one or more electrical characteristics.

BRIEF DESCRIPTION OF THE DRAWINGS

Reference is made to the accompanying drawings in which particular embodiments and further benefits of the invention are illustrated as described in more detail in the description below, in which.

DETAILED DESCRIPTION

Figure 1:
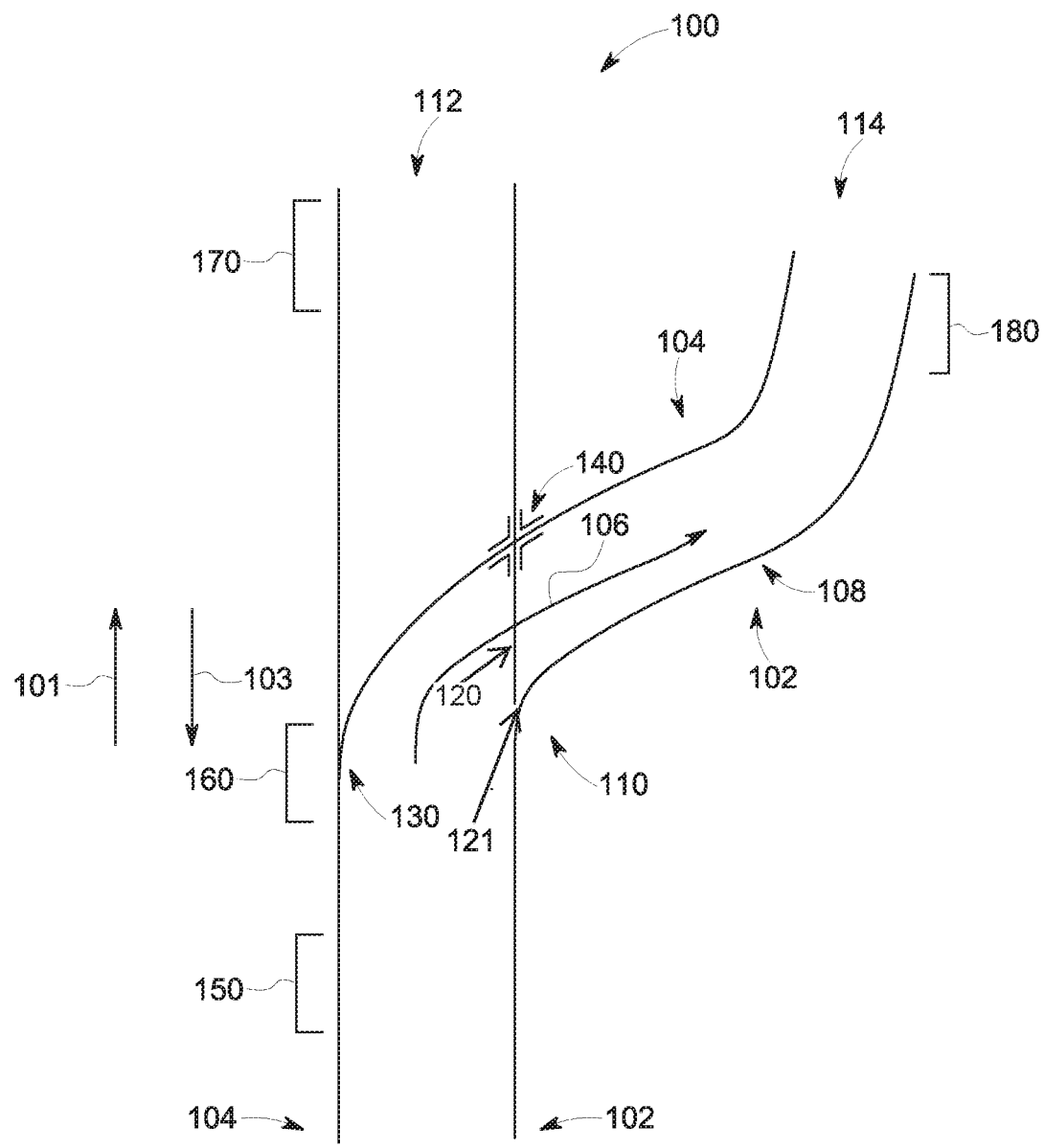
FIG. 1 is a schematic illustration of a rail route including a switch.

The term "vehicle" as used herein may be defined as a mobile machine that transports at least one of a person, people, or a cargo. For instance, a vehicle may be, but is not limited to being, a rail car, an intermodal container, a locomotive, a marine vessel, mining equipment, construction equipment, an automobile, and the like. A "vehicle system" includes at least one vehicle. In some embodiments, a vehicle system may include two or more vehicles that are interconnected with each other to travel along a route. For example, a vehicle system may include two or more vehicles that are directly connected to each other (e.g., by a coupler) or that are indirectly connected with each other (e.g., by one or more other vehicles and couplers). A vehicle system may be referred to as a consist, such as a rail vehicle consist.

"Software" or "computer program" as used herein includes, but is not limited to, one or more computer readable and/or executable instructions that cause a computer or other electronic device to perform functions, actions, and/or behave in a desired manner. The instructions may be embodied in various forms such as routines, algorithms, modules or programs including separate applications or code from dynamically linked libraries. Software may also be implemented in various forms such as a stand-alone program, a function call, a servlet, an applet, an application, instructions stored in a memory, part of an operating system or other type of executable instructions. "Computer" or "processing element" or "computer device" or "processor" or "processing unit," as used herein includes, but is not limited to, any programmed or programmable electronic device that may store, retrieve, and process data. "Non-transitory computer-readable media" include, but are not limited to, a CD-ROM, a removable flash memory card, a hard disk drive, a magnetic tape, and a floppy disk. "Computer memory", as used herein, refers to a storage device configured to store digital data or information which may be retrieved by a computer or processing element. "Controller," "unit," "component," and/or "module," as used herein, may refer to the logic circuitry and/or processing elements (e.g., one or more computer processors) and associated software or program. The terms "signal", "data", and "information" may be used interchangeably herein and may refer to digital or analog forms.

Embodiments of the inventive subject matter relate to methods and systems for identifying one or more construction features along a route being traveled upon by a vehicle system, for example, in order to identify a location of the vehicle system along the route and/or a particular one of parallel routes upon which the vehicle system is traveling. For example, the vehicle system may examine the route by injecting an electrical signal into the route from a first vehicle in the vehicle system as the vehicle system travels along the route and monitoring the route at another, second vehicle that also is in the vehicle system. As another example, an electrical signal may be injected into the route by the same vehicle that monitors the route. Further, in some embodiment, multiple transmitters may be used to inject different examination signals into the route and/or multiple receivers may be used to monitor the examination signals. For example, a first transmitter and a first receiver may be disposed on a first side (e.g., left side) of a vehicle, and a second transmitter and a second receiver may be disposed on a second side (e.g., right side) of a vehicle. The route, for example may be a track of a rail vehicle system. The electrical signal that is injected into the route may be powered by an onboard energy storage device, such as one or more batteries, and/or an off-board energy source, such as a catenary and/or electrified rail of the route.

When the construction feature is identified, one or more actions may be initiated. For example, the location may be compared with a location determined or provided via a different technique to check or confirm the result provided by the different technique. As another example, the location may be communicated to an off-board facility, for example, for scheduling or dispatching purposes.

In various embodiments, electronic signatures (e.g., one or more electrical characteristics of one or more examination signals) observed, collected, or obtained as a vehicle passes over a route (e.g., a section of track) may be used to determine or confirm the route of travel (and/or location along the route of travel). For example, electronic signatures may be generated by coupling a frequency signal or signals to a track from a vehicle by inductive or magnetic coupling, and monitoring the injected signal at one or more other points on the vehicle. (For a more detailed discussion of injection of examination signals, see the '310 application.) A sampled waveform of the monitored examination signals may be indicative of one or more construction features of the route. As used herein, a construction feature may be understood as a designed, or man-made, feature of the route, such as, by way of example, a switch or portion of a switch, a cross-over (e.g., a combination of two or more switches), a diamond crossing (e.g., a location where two sets of tracks cross each other), or a length of track passing over a structure (e.g., a bridge). A rolling surface construction feature may be understood as used herein as a man-made aspect or portion of a route that includes a discontinuity or other variation along a surface of a route being traveled (e.g., a surface of a rail that is contacted by wheels of a vehicle traveling the rail). For example, a rolling surface construction feature may include a switch, cross-over, or diamond crossing, but does not include a bridge or other support structure. A structural support construction feature may be understood as used herein as a man-made support structure that supports a route being traveled. For example, a bridge is an example of a structural support construction feature. The sampled waveform, for example, may be indicative of whether the vehicle (e.g., a rail vehicle) is traveling on normal track, or through a turnout or track switch. Further, if the vehicle is traveling through a turnout or switch, the signatures may indicate whether the vehicle is traveling in a facing direction (e.g., along a direction in which two tracks separate at a switch) or in a trailing direction (e.g., along a direction in which two tracks are joined or merged at a switch), and/or may indicate whether the vehicle is moving over the switch when the switch is in a normal (e.g., straight) position, or in a reverse (e.g., diverging) position.

Injection of examination signals into a track in various embodiments produces unique or otherwise identifiable waveforms corresponding to construction features of the track that are passed over by a vehicle. The waveforms may be identifiable in that the waveforms may be sufficiently different that the waveforms can be distinguished from each other. These types of waveforms can be referred to as distinguishable waveforms. The unique or otherwise identifiable waveforms may be created by changes in the amount and/or shape of ferrous materials in the track structure below the vehicle as the vehicle passes the feature. For example, various components of a track switch, such as a point rail, cross rail, frog, heelblock, or the like, can affect the shape of the waveform and characterize the signature. The shape of the waveform may be altered in that a magnitude of one or more portions of the waveform may increase or decrease, a width dimension of one or more portions of the waveform may change, a frequency of the waveform may change, a slope of one or more segments of the waveform may change, an area bounded by one or more portions of the waveform may grow or shrink, or the like.

A signature may correspond, for example, to a particular attribute of a switch, such as a point rail or frog. A signature may also correspond, to a particular sequence of attributes. For example, a particular sequence of attributes may be identified to determine if the vehicle is traveling in a facing direction or trailing direction, or if the switch is in the normal position or reverse position. Further still, the distance (and/or time elapsed) between attributes of a switch may be used to distinguish the switch from other switches (e.g., to distinguish a relatively long switch from a relatively short switch). For example, the size or angle of a turnout may be determined by evaluating the length of a signature waveshape with respect to direction of travel of the vehicle, as well as speed of travel and elapsed time between one or more attributes of the waveshape. It may be noted that the generation of unique signatures regarding, for example, switches (and/or positions of switches), may be enhanced by inductively coupling transmitters and/or receivers of the examination signal(s) to the track structure. The mass and/or shape of the track material (e.g., steel, iron) changes underneath the receivers as the vehicle traverses over a switch, shaping the signals. Use of induction may yield a more meaningful or distinguishable signature then when using a contact method for sending signals through a conductive loop.

A technical effect of various embodiments includes improved detection of vehicle location and/or direction. A technical effect of various embodiments includes improved safety. A technical effect of various embodiments includes reduction of risk in vehicle systems and/or networks (e.g., due to improved determination of location of a vehicle). A technical effect of various embodiments includes improved determination and/or confirmation of a switch position.

FIG. 1 is a schematic illustration of a route 100 including a switch 110 that is used to direct a vehicle along a first track 112 or a second track 114. The vehicle may be traveling in a facing direction 101 or in a trailing direction 103. The route 100 may be understood as having a right side 102 and a left side 104 as shown in FIG. 1. It may be noted that "right" and "left" are used as labels only for ease of clarity in FIG. 1, and that the "right" and "left" sides of the track may vary in other embodiments, for example, depending on direction of travel. When the vehicle is traveling in the facing direction 101 and the switch 110 is set in the normal position, the vehicle is directed along the first track 112 (e.g., straight up as seen in FIG. 1). When the vehicle is traveling in the facing direction 101 and the switch 110 is set in the reverse position, the vehicle is directed along the second track 114 (e.g., to the right as seen in FIG. 1). In FIG. 1, the switch 110 is shown in the reverse position, so that the vehicle is directed along path 106 when traveling in the facing direction 101.

As seen in FIG. 1, the route 100 includes a first insulated joint 150, a second insulated joint 160, a third insulated joint 170, and a fourth insulated joint 180. The first insulated joint 150, third insulated joint 170, and fourth insulated joint 180 each correspond to a corresponding signal, while the second insulated joint 160 corresponds to the switch 110. As the vehicle passes over the various insulated joints, the monitored waveforms may experience a noticeable drop in amplitude or strength due to the insulation of the insulated joints. By identifying these drops in amplitude or strength, the passage of a vehicle over insulated joints may be identified. The distance between the insulated joints (e.g., using the speed of the vehicle and time elapsed between passage over insulated joints) may be used in identifying a construction feature or differentiating between construction features. For example, if two switches have a generally similar configuration, but have distinguishable distances between insulated joints of associated signals, the distances between the insulated joints may be used to differentiate passage over the two switches.

The switch 110 includes various features or attributes. For example, the switch 110 includes a first attribute 120 along the right side 102 of the first track 112 and second track 114. The first attribute 120 may vary as a function of switch position. For example, when the switch 110 is in the reverse position as shown, and the vehicle is traveling in the facing direction 101 as shown in FIG. 1, there may be a gap 121 between the right side 102 of the first track 112 and the right side 102 of the second track 114 proximate the first attribute 120 to allow passage of the wheels on the right side of the vehicle through the gap to allow the vehicle to pass through the switch and travel along the second track 114 along the path 106 in the facing direction 110. However, when the switch 110 is in the normal position, the right side 102 of the second track 114 may be placed at or near contact with the right side 102 of the first track 112 proximate the first attribute 120 to direct the vehicle along the first track 110. The signature of the examination signal as the vehicle passes over the first attribute 120 may be affected by the presence or absence of the gap. Thus, the signature may be used to identify whether the switch 110 is in the normal or reverse position.

As another example, the switch 110 includes a second attribute 130 along the left side 104 of the first track 112. When the switch 110 is in the reverse position as shown, the left side 104 of the second track 114 may be placed at or near contact with the left side 104 of the first track 112 proximate the second attribute 130 to direct the vehicle from the first track 110 to the second track 114. However, when the switch 110 is in the normal position, there may be a gap (not shown in FIG. 1) between the left side 104 of the first track 112 and the left side 104 of the second track 114 proximate the second attribute 130 to allow passage of the wheels on the left side of the vehicle through the gap to allow the vehicle to pass through the switch and travel along the first track 112 in the facing direction 110. The signature of the examination signal as the vehicle passes over the second attribute may be affected by the presence or absence of the gap. Thus, the signature may be used to identify whether the switch 110 is in the normal or reverse position.

As one more example, the switch 110 includes a third attribute 140. The third attribute 140 includes a section of the route 100 where rails of the first track 112 (e.g., the right side 102 of the first track 112) cross rails of the second track 114 (e.g., the left side 104 of the second track 114). Such an attribute may be called a frog or switch frog, and may include a relatively large amount of track material (e.g., iron or ferrous material) providing an identifiable signature to the monitored examination signal corresponding to passage over the frog. For example, if the third attribute 140 is encountered by the right side of the vehicle after the insulated joint 160 has been passed, the vehicle may be understood to be traveling along the first track 112 in the facing direction 101. As another example, if the third attribute 140 is encountered by the left side of the vehicle after the insulated joint 160 has been passed, the vehicle may be understood to be traveling along the second track 114 in the facing direction 101. On the other hand, if the third attribute 140 is encountered before the second insulated joint 160, the vehicle may be understood to be traveling in the trailing direction 103, with the side of the vehicle that encounters the third attribute 140 providing information on the position of the switch 110 and the identification of the track from which the switch 110 is approached.

While, as discussed herein, portions of a monitored examination signal corresponding to individual attributes (e.g., first attribute 120, second attribute 130, third attribute 140) may provide information describing or corresponding to the direction of travel, the setting of a switch, and the differentiation of a switch from other switches, greater precision and/or reliability may be achieved by a consideration of multiple attributes of a monitored examination signal, including the sequence of the attributes as well as the time elapsed between attributes. (The time elapsed between attributes of the monitored examination signal may also provide the distance between corresponding attributes of the route based on the speed of the vehicle.) Thus, a combination of characteristics of a monitored examination signal corresponding to one or more attributes, aspects, or features of a route being traveled over may be used to determine the identity of a particular construction feature (e.g., to identify the feature as a switch and to distinguish the switch from other switches along the route) and/or to determine the setting of a switch and the direction of travel (which may be used to determine a particular one of generally parallel or otherwise close tracks upon which a vehicle is traveling).

For instance, in one example scenario corresponding to FIG. 1, a monitored examination signal may include a signature corresponding to one or more of encountering no gap at the second attribute 130 along the left side of a vehicle, encountering a gap at the first attribute 120 along the right side of the vehicle, and the third attribute 140 being encountered by the left side of the vehicle. Accordingly, it may be determined that the vehicle is traveling in the facing direction 101, that the switch 110 is in the reverse position, and that the vehicle is traveling along the second track 114 after passage through the switch 110. Additionally or alternatively, the distance between pulses of the examination signal caused by insulated joints may be determined, with the distances providing information on the direction of travel and the setting of the switch (provided that the distances between the second insulated joint 160 and the other insulated joints are different from each other).

It may be noted that the particular configuration of the switch 110 and the aspects of the example scenario discussed above are provided by way of example only, and that other switches or construction features or aspects thereof may be examined and/or other characteristics of a signal or portions of a signature utilized. Generally, signatures or characteristic waveforms of one or more portions of a monitored examination signal may be used to differentiate between construction features encountered by a vehicle. By identifying, for example, the particular features encountered, as well as the sequence and/or time of encountering the particular features, the location of the vehicle may be determined along a length of a route, as well as identifying a particular track (e.g., a particular one of two or more generally parallel tracks) upon which the vehicle is traveling. In some embodiments, a database of signatures characterizing each feature such as switches, crossings, bridges, or the like of a route may be developed. For features that are not symmetric along the length of the route, a separate signature for each direction of travel may be maintained. For features such as switches that have different settings, separate signatures may be maintained in the database for the different positions as well as direction of travel.

By comparing an obtained examination signal signature with the database and identifying the stored signature that most closely resembles the obtained examination signature (or that resembles or otherwise matches the obtained examination signature more than one or more other stored signatures, but not necessarily all other stored signatures), the identity of the feature (as well as any settings of the feature and/or the direction of travel) may be determined using known locations of the construction features. In some embodiments, a series of construction features previously encountered may be used to estimate a location, for example to confirm a construction feature and/or location selected from a databased, to narrow a field of construction features searched or compared (e.g., based on location within a predetermined range of the location estimated using previously encountered construction features), and/or to help select among viable alternative signatures that are each similar to the examined signature. With the features being passed over by the vehicle being determined (as well as the direction of travel), the location of the vehicle may be determined. It may be noted that the duration of a signal may be used to help identify a construction feature. For example, a bridge may have an increased amount of iron resulting in a recognizable signature that has a duration corresponding to the length of the bridge. Thus, the duration of the signal may be used to identify that the vehicle has passed over a particular bridge (e.g., a longer bridge may have a longer associated signature than a shorter bridge of otherwise generally similar construction).

Figure 2:
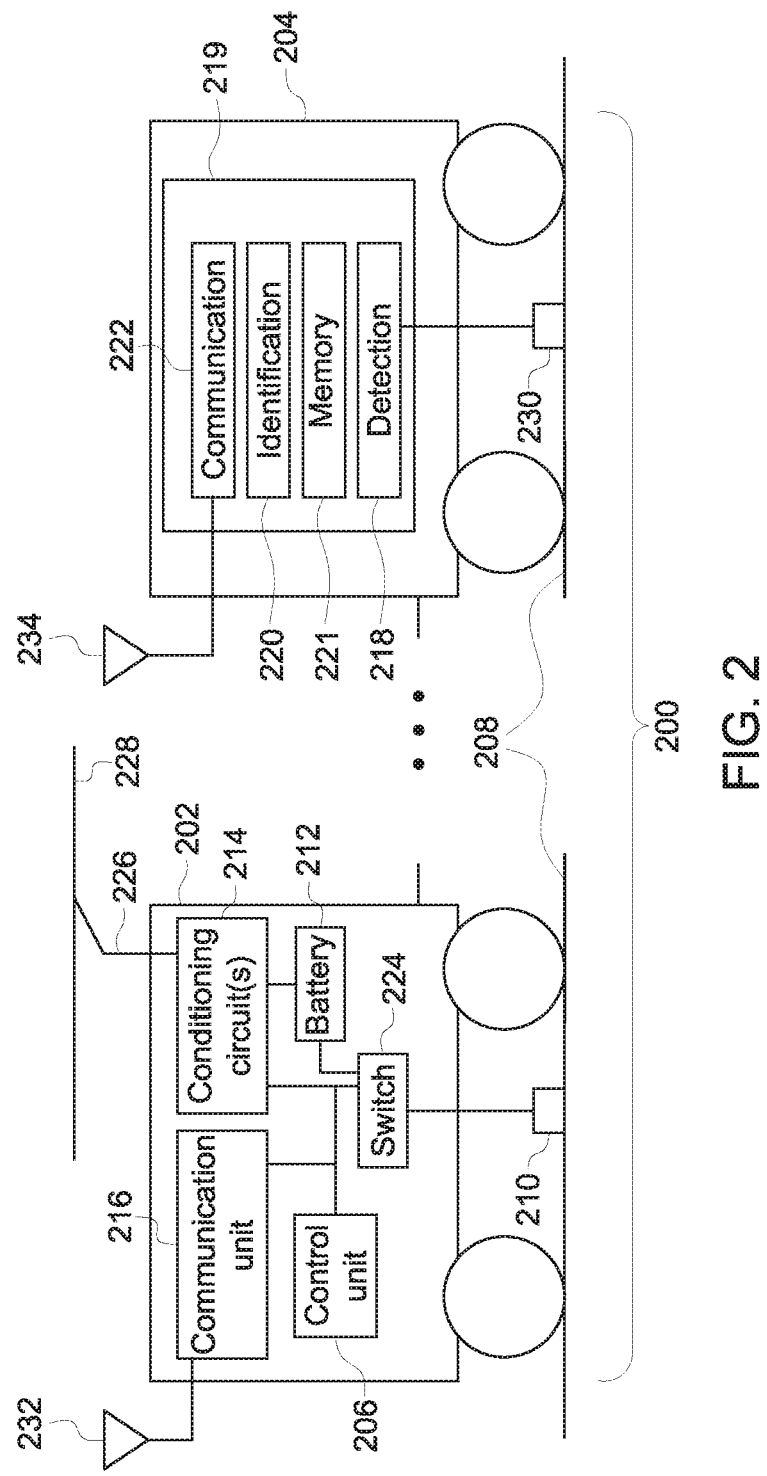
FIG. 2 is a schematic illustration of an embodiment of an examining system.

FIG. 2 is a schematic illustration of an embodiment of an examining system 200. The examining system 200 is depicted in FIG. 2 as distributed between a first vehicle 202 and a second vehicle 204 in the same vehicle system; however, in other embodiments the examining system 200 may be disposed on a single vehicle. In other examples, the examining system 200 may be distributed among three or more vehicles. The route 208 may be a body, surface, or medium on which the vehicle system 100 travels. In an embodiment, the route 208 may include or represent a body that is capable of conveying a signal between vehicles in the vehicle system 200, such as a conductive body capable of conveying an electrical signal (e.g., a direct current, alternating current, radio frequency, or other signal).

The examining system 200 includes several components described below that are disposed onboard the vehicles 202, 204. For example, the illustrated embodiment of the examining system 200 includes a control unit 208, an application device 210, an onboard power source 212 ("Battery" in FIG. 2), one or more conditioning circuits 214, a communication unit 216, and one or more switches 224 disposed onboard the first vehicle 202. The examining system 200 also includes a detection module 218, an identification module 220, a detection device 230, and a communication unit 222 disposed onboard the second vehicle 204. Alternatively, one or more of the control unit 208, application device 210, power source 212, conditioning circuits 214, communication unit 216, and/or switch 224 may be disposed onboard the second vehicle 204 and/or another vehicle in the same vehicle system, and/or one or more of the detection module 218, identification module 220, detection device 230, and communication unit 222 may be disposed onboard the first vehicle 202 and/or another vehicle in the same vehicle system. It may be noted that in the illustrated embodiment, the detection device 230 and the application device 220 are schematically depicted as being disposed in intermediate positions between axles of different vehicles. For example, the detection device 230 and application device 210 in various embodiments may be located as shown and may be configured to transmit and receive signals via an additional rail not in electrical communication with the axles of the vehicles 202, 204. In other embodiments, the detection device 230 and application device 210 may be configured to transmit and receive signals transmitted through tracks contacted by wheels of the vehicles 202, 204, and may be disposed at nearest ends of adjacent vehicles, without any axles interposed between the detection device 230 and the application device 210, to reduce any signal transmission issues that may be affected by shunting by the axles.

The control unit 206 controls supply of electric current to the application device 210. In an embodiment, the application device 210 includes one or more conductive bodies that engage the route 208 as the vehicle system that includes the vehicle 202 travels along the route 208. For example, the application device 210 may include a conductive shoe, brush, or other body that slides along an upper and/or side surface of a track such that a conductive pathway is created that extends through the application device 210 and the track. Additionally or alternatively, the application device 210 may include a conductive portion of a wheel of the first vehicle 202, such as the conductive outer periphery or circumference of the wheel that engages the route 208 as the first vehicle 202 travels along the route 208. In another embodiment, the application device 210 may be inductively coupled with the route 208 without engaging or touching the route 208 or any component that engages the route 208.

The application device 210 is conductively coupled with the switch 224, which may represent one or more devices that control the flow of electric current from the onboard power source 212 and/or the conditioning circuits 214. The switch 224 may be controlled by the control unit 206 so that the control unit 206 may turn on or off the flow of electric current through the application device 210 to the route 208. In an embodiment, the switch 224 also may be controlled by the control unit 206 to vary one or more waveforms and/or waveform characteristics (e.g., phase, frequency, amplitude, and the like) of the current that is applied to the route 208 by the application device 210.

The onboard power source 212 represents one or more devices capable of storing electric energy, such as one or more batteries, capacitors, flywheels, and the like. Additionally or alternatively, the power source 212 may represent one or more devices capable of generating electric current, such as an alternator, generator, photovoltaic device, gas turbine, or the like. The power source 212 is coupled with the switch 224 so that the control unit 206 may control when the electric energy stored in the power source 212 and/or the electric current generated by the power source 212 is conveyed as electric current (e.g., direct current, alternating current, an RF signal, or the like) to the route 208 via the application device 210.

The conditioning circuit 214 represents one or more circuits and electric components that change characteristics of electric current. For example, the conditioning circuit 214 may include one or more inverters, converters, transformers, batteries, capacitors, resistors, inductors, and the like. In the illustrated embodiment, the conditioning circuit 214 is coupled with a connecting assembly 226 that is configured to receive electric current from an off-board source. For example, the connecting assembly 226 may include a pantograph that engages an electrified conductive pathway 228 (e.g., a catenary) extending along the route 208 such that the electric current from the catenary 228 is conveyed via the connecting assembly 226 to the conditioning circuit 214. Additionally or alternatively, the electrified conductive pathway 228 may represent an electrified portion of the route 208 (e.g., an electrified rail) and the connecting assembly 226 may include a conductive shoe, brush, portion of a wheel, or other body that engages the electrified portion of the route 208. Electric current is conveyed from the electrified portion of the route 208 through the connecting assembly 226 and to the conditioning circuit 214.

The electric current that is conveyed to the conditioning circuit 214 from the power source 212 and/or the off-board source (e.g., via the connecting assembly 226) may be altered by the conditioning circuit 214. For example, the conditioning circuit 214 may change the voltage, current, frequency, phase, magnitude, intensity, waveform, and the like, of the current that is received from the power source 212 and/or the connecting assembly 226. The modified current may be the examination signal that is electrically injected into the route 208 by the application device 210. Additionally or alternatively, the control unit 206 may form the examination signal by controlling the switch 224. For example, the examination signal may be formed by turning the switch 224 on to allow current to flow from the conditioning circuit 214 and/or the power source 212 to the application device 210.

In an embodiment, the control unit 206 may control the conditioning circuit 214 to form the examination signal. For example, the control unit 206 may control the conditioning circuit 214 to change the voltage, current, frequency, phase, magnitude, intensity, waveform, and the like, of the current that is received from the power source 212 and/or the connecting assembly 226 to form the examination signal.

The examination signal is conducted through the application device 210 to the route 208, and is electrically injected into a conductive portion of the route 208. For example, the examination signal may be conducted into a conductive track of the route 208. In another embodiment, the application device 210 may not directly engage (e.g., touch) the route 208, but may be wirelessly coupled with the route 208 in order to electrically inject the examination signal into the route 208 (e.g., via induction).

The conductive portion of the route 208 that extends between the first and second vehicles 202, 204 during travel of the vehicle system may form a track circuit through which the examination signal may be conducted. The first vehicle 202 may be coupled (e.g., coupled physically, coupled wirelessly, among others) to the track circuit by the application device 210. The power source (e.g., the onboard power source 212 and/or the off-board electrified conductive pathway 228) may transfer power (e.g., the examination signal) through the track circuit toward the second vehicle 204.

By way of example and not limitation, the first vehicle 202 may be coupled to a track of the route 208, and the track may be the track circuit that extends and conductively couples one or more components of the examining system 200 on the first vehicle 202 with one or more components of the examining system 200 on the second vehicle 204.

In an embodiment, the control unit 206 includes or represents a manager component. Such a manager component may be configured to activate a transmission of electric current into the route 208 via the application device 210. In another instance, the manager component may activate or deactivate a transfer of the portion of power from the onboard and/or off-board power source to the application device 210, such as by controlling the switch and/or conditioning circuit. Moreover, the manager component may adjust parameter(s) associated with the portion of power that is transferred to the route 208. For instance, the manager component may adjust an amount of power transferred, a frequency at which the power is transferred (e.g., a pulsed power delivery, AC power, among others), a duration of time the portion of power is transferred, among others. Such parameter(s) may be adjusted by the manager component based on at least one of a geographic location of the vehicle or the device or an identification of the device (e.g., type, location, make, model, among others).

The manager component may leverage a geographic location of the vehicle or the device in order to adjust a parameter for the portion of power that may be transferred to the device from the power source. For instance, the amount of power transferred may be adjusted by the manager component based on the device power input. By way of example and not limitation, the portion of power transferred may meet or be below the device power input in order to reduce risk of damage to the device. In another example, the geographic location of the vehicle and/or the device may be utilized to identify a particular device and, in turn, a power input for such device.

The detection module 218 disposed onboard the second vehicle 204 as shown in FIG. 2 monitors the route 208 to attempt to detect the examination signal that is injected into the route 208 by the first vehicle 202. The detection module 218 is coupled with the detection device 230. In an embodiment, the detection device 230 includes one or more conductive bodies that engage the route 208 as the vehicle system that includes the vehicle 204 travels along the route 208. For example, the detection device 230 may include a conductive shoe, brush, or other body that slides along an upper and/or side surface of a track such that a conductive pathway is created that extends through the detection device 230 and the track. Additionally or alternatively, the detection device 230 may include a conductive portion of a wheel of the second vehicle 204, such as the conductive outer periphery or circumference of the wheel that engages the route 208 as the second vehicle 204 travels along the route 208. In another embodiment, the detection device 230 may be inductively coupled with the route 208 without engaging or touching the route 208 or any component that engages the route 208.

The detection module 218 monitors one or more electrical characteristics of the route 208 using the detection device 230. For example, the voltage of a direct current conducted by the route 208 may be detected by monitoring the voltage conducted by from the route 208 to the detection device 230 and/or the current (e.g., frequency, amps, phases, or the like) of an alternating current or RF signal being conducted by the route 208 may be detected by monitoring the current conducted by the route 208 to the detection device 230. The detection module 218 determines one or more electrical characteristics of the signal (e.g., voltage, frequency, phase, waveform, intensity, or the like) that is received (e.g., picked up) by the detection device 230 from the route 208 and reports the characteristics of the received signal to the identification module 220. If no signal is received by the detection device 230, then the detection module 218 may report the absence of such a signal to the identification module 220. For example, if the detection module 218 does not detect at least a designated voltage, designated current, or the like, as being received by the detection device 230, then the detection module 218 may not detect any received signal. Alternatively or additionally, the detection module 218 may communicate the detection of a signal that is received by the detection device 230 only upon detection of the signal by the detection device 230.

In an embodiment, the detection module 218 may determine the characteristics of the signals received by the detection device 230 in response to a notification received from the control unit 206 in the first vehicle 202. For example, when the control unit 206 is to cause the application device 210 to inject the examination signal into the route 208, the control unit 206 may direct the communication unit 216 to transmit a notification signal to the detection device 230 via the communication unit 222 of the second vehicle 204. The communication units 216, 222 may include respective antennas 232, 234 and associated circuitry for wirelessly communicating signals between the vehicles 202, 204, and/or with off-board locations. The communication unit 216 may wirelessly transmit a notification to the detection module 218 that instructs the detection module 218 as to when the examination signal is to be input into the route 208. Additionally or alternatively, the communication units 216, 222 may be connected via one or more wires, cables, and the like, such as a multiple unit (MU) cable, train line, or other conductive pathway(s), to allow communication between the communication units 216, 222.

The detection module 218 may begin monitoring signals received by the detection device 230. For example, the detection module 218 may not begin or resume monitoring the received signals of the detection device 230 unless or until the detection module 218 is instructed that the control unit 206 is causing the injection of the examination signal into the route 208. Alternatively or additionally, the detection module 218 may periodically monitor the detection device 230 for received signals and/or may monitor the detection device 230 for received signals upon being manually prompted by an operator of the examining system 200.

The identification module 220 receives the characteristics of the received signal from the detection module 218. In the illustrated embodiment, The detection module 218, identification module 220, and communication unit 222, along with a memory 221 (e.g., a tangible and non-transitory computer storage medium storing one or more instruction sets for performing tasks disclosed herein, storing one or more databases correlating signatures to construction features and/or location, or the like) are shown as part of a processing unit 219. The processing unit 219 may include one or more processors. Alternatively, one or more aspects of the processing unit 219 may be a portion of an additional processing unit. In various embodiments the processing unit 219 includes processing circuitry configured to perform one or more tasks, functions, or steps discussed herein. It may be noted that "processing unit" as used herein is not intended to necessarily be limited to a single processor or computer. For example, the processing unit 219 may include multiple processors and/or computers, which may be integrated in a common housing or unit, or which may distributed among various units or housings. It may be noted that operations performed by the processing unit 219 (e.g., operations corresponding to process flows or methods discussed herein, or aspects thereof) may be sufficiently complex that the operations may not be performed by a human being within a reasonable time period. For example, the analysis of electrical characteristics of a signal, the analysis of a signature, the identification of a signature from a database corresponding to a currently analyzed signature, or the like, may rely on or utilize computations that may not be completed by a person within a reasonable time period.

The identification module 220 examines one or more electrical characteristics (e.g., a shape of a waveform, a strength of a signal, a duration of one or more portions of a signal, or the like) of a monitored examination signal, and identifies a construction feature corresponding to the monitored signal to identify a construction feature (e.g., switch, diamond crossing, bridge, or the like) that the vehicle passed over corresponding to the monitored examination signal. For example, as also discussed in connection with FIG. 1, the identification module 220 may identify a switch, as well as the direction of travel through the switch and the setting of the switch based on the one or more electrical characteristics. For example, a signature determined or generated based on the one or more electrical characteristics may be compared to a database of signatures for known construction features along the route. It may be noted that more than one examination signal may be analyzed. For example, separate detectors and transmitters may be positioned on each side of a vehicle, resulting in four signals that may be analyzed (e.g., a first signal transmitted from the left side and received at the left side, a second signal transmitted from the left side and receive at the right side, a third signal transmitted from the right side and received at the right side, and a fourth signal transmitted from the right side and received at the left side). Various characteristics or attributes of the signals (and/or sequences and/or durations of characteristics or attributes of the signal) may be used to identify a particular feature over which the vehicle has passed. Settings of the feature may also be determined. For example, the setting of a switch over which the vehicle has passed may be determined.

The identity and/or setting of the features passed over may be used to determine a location of the vehicle. The identification module 220 may determine the location of a vehicle along a route. For example, the identification module 220 may determine the position of the vehicle along a length of the route. In some embodiments, the location of construction features along a length of the route may be maintained, for example in a database. Thus, by identifying the time of passage over a given construction feature along with the time elapsed since passing over the construction feature and the speed of the vehicle during the time elapsed, along with the direction of travel, the position of the vehicle may be determined (or an otherwise determined location may be confirmed). Alternatively or additionally, for a vehicle traveling among a group of generally parallel paths, the particular path upon which the vehicle is traveling may be determined by the identification unit. For example, by identifying a particular switch passed over, as well as the direction of travel and setting of the switch, a particular path to which the switch has directed the vehicle may be determined.

It may be noted that a duration of one or more characteristics of the signal and/or a duration between characteristics may also be utilized to identify a feature (and, as a result, it identify a location) by the identification module 220. For example, the duration of characteristics of a signal corresponding to a switch may correlate to or provide information regarding the size of the switch, helping to distinguish the switch from differently sized switches. As another example, the duration of characteristics corresponding to travel over a bridge may provide information correlating to or providing information regarding the length of the bridge, helping to distinguish the bridge from differently sized bridges. As one more example, the duration between pulses associated with insulated joints (e.g., insulated joints of a switch and signals on either side of the switch) may correlate to or provide information regarding the distance between the signals and the switch, helping to distinguish the switch (as well as the direction of travel) from switches having signals placed at different distances relative to the switch.

The identification module 220 may include or be communicatively coupled (e.g., by one or more wired and/or wireless connections that allow communication) with a location determining unit that may determine the location of the vehicle 204 and/or vehicle system. For example, the location determining unit may include a GPS unit or other device that may determine where the first vehicle and/or second vehicle are located along the route 208. The distance between the first vehicle 202 and the second vehicle 204 along the length of the vehicle system may be known to the identification module 220, such as by inputting the distance into the identification module 220 using one or more input devices and/or via the communication unit 222. The location determined by the identification module 220 may be compared to the location provided by the location determining unit as a check or to confirm the location.

Figure 3:
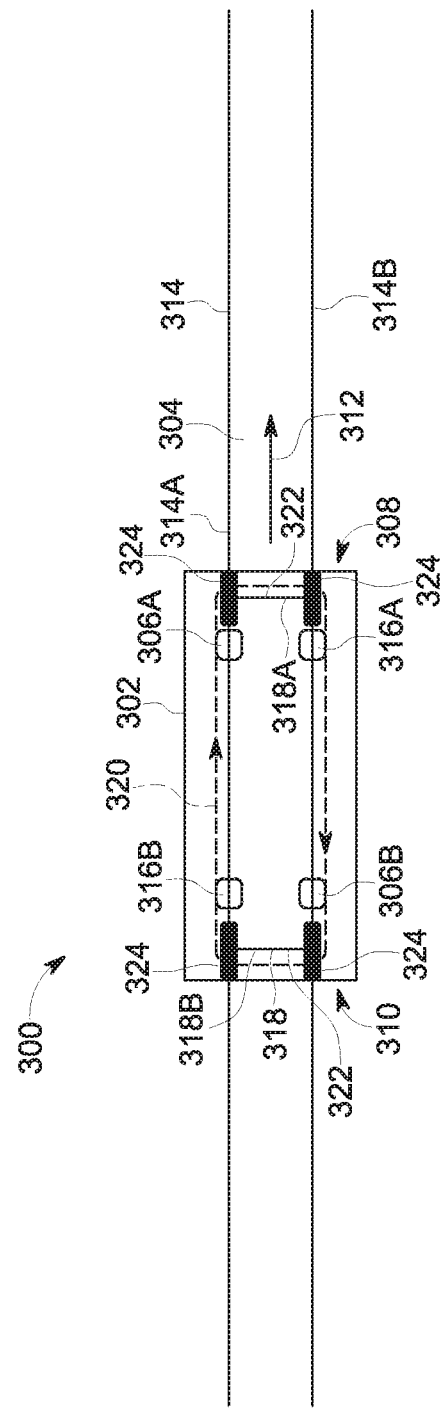
FIG. 3 is a schematic illustration of an embodiment of an examining system on a vehicle of a vehicle system traveling along a route.

FIG. 3 is a schematic illustration of an embodiment of an examining system 300 on a vehicle 302 of a vehicle system (not shown) traveling along a route 304. The examining system 300 may represent the examining system 200 shown in FIG. 2. In contrast to the examining system 200, the examining system 300 is disposed within a single vehicle 302. FIG. 3 may be understood as a top-down view looking at least partially through the vehicle 302. The vehicle 302 may be one of multiple vehicles of the vehicle system 302.

The vehicle 302 includes multiple transmitters or application devices 306 disposed onboard the vehicle 302. The application devices 306 may be positioned at spaced apart locations along the length of the vehicle 302. For example, a first application device 306A may be located closer to a front end 308 of the vehicle 302 relative to a second application device 306B located closer to a rear end 310 of the vehicle 302. The designations of "front" and "rear" may be based on the direction of travel 312 of the vehicle 302 along the route 304. As shown in FIG. 3, the first application device 306A and second application device 306B may be disposed on different sides (e.g., left or right in the direction of travel) of the vehicle 302.

The route 304 includes conductive tracks 314 in parallel, and the application devices 306 are configured to be conductively and/or inductively coupled with at least one conductive track 314 along the route 304. For example, the conductive tracks 314 may be rails in a railway context. In an embodiment, the first application device 306A is configured to be conductively and/or inductively coupled with a first conductive track 314A, and the second application device 306B is configured to be conductively and/or inductively coupled with a second conductive track 314B. As such, the application devices 306 may be disposed on the vehicle 302 diagonally from each other as shown in FIG. 3. The application devices 306 are utilized to electrically inject at least one examination signal into the route. For example, the first application device 306A may be used to inject a first examination signal into the first conductive track 314A of the route 304. Likewise, the second application device 306B may be used to inject a second examination signal into the second conductive track 314B of the route 304.

The vehicle 302 also includes multiple receiver coils or detection units 316 disposed onboard the vehicle 302. The detection units 316 are positioned at spaced apart locations along the length of the vehicle 302. For example, a first detection unit 316A may be located towards the front end 308 of the vehicle 302 relative to a second detection unit 316B located closer to the rear end 310 of the vehicle 302, with the first detection unit 316A disposed on an opposite or different side of the vehicle 302 along a direction of travel (e.g., left or right) than the second detection unit 316B. The detection units 316 are configured to monitor one or more electrical characteristics of the route 304 along the conductive tracks 314 in response to the examination signals being injected into the route 304. The electrical characteristics that are monitored may include an amplitude of a current, a phase shift, a modulation, a frequency, a voltage, an impedance, and the like. For example, the first detection unit 316A may be configured to monitor one or more electrical characteristics of the route 304 along the second track 314B, and the second detection unit 316B may be configured to monitor one or more electrical characteristics of the route 304 along the first track 314A. As such, the detection units 316 may be disposed on the vehicle 302 diagonally from each other. In an embodiment, each of the application devices 306A, 306B and the detection units 316A, 316B may define individual corners of a test section of the vehicle 302. Optionally, the application devices 306 and/or the detection units 316 may be staggered in location along the length and/or width of the vehicle 302. Optionally, the application device 306A and detection unit 316A and/or the application device 306B and detection unit 316B may be disposed along the same track 314. The application devices 306 and/or detection units 316 may be disposed on the vehicle 302 at other locations in other embodiments.

In an embodiment, two of the conductive tracks 314 (e.g., tracks 314A and 314B) may be conductively and/or inductively coupled to each other through multiple shunts 318 along the length of the vehicle 302. For example, the vehicle 302 may include two shunts 318, with one shunt 318A located closer to the front 308 of the vehicle 302 relative to the other shunt 318B. In an embodiment, the shunts 318 are conductive and together with the tracks 314 define an electrically conductive test loop 320. The conductive test loop 320 represents a track circuit or circuit path along the conductive tracks 314 between the shunts 318. The test loop 320 moves along the tracks 314 as the vehicle 302 travels along the route 304 in the direction 312. Therefore, the section of the conductive tracks 314 defining part of the conductive test loop 320 changes as the vehicle 302 progresses on a trip along the route 304.

In an embodiment, the application devices 306 and the detection units 316 are in electrical contact with the conductive test loop 320. For example, the application device 306A may be in electrical contact with track 314A and/or shunt 318A; the application device 306B may be in electrical contact with track 314B and/or shunt 318B; the detection unit 316A may be in electrical contact with track 314B and/or shunt 318A; and the detection unit 316B may be in electrical contact with track 314A and/or shunt 318B.

The two shunts 318A, 318B may be first and second trucks disposed on a rail vehicle. Each truck 318 includes an axle 322 interconnecting two wheels 324. Each wheel 324 contacts a respective one of the tracks 314. The wheels 324 and the axle 322 of each of the trucks 318 are configured to electrically connect (e.g., short) the two tracks 314A, 314B to define respective ends of the conductive test loop 320. For example, the injected first and second examination signals may circulate the conductive test loop 320 along the length of a section of the first track 314A, through the wheels 324 and axle 322 of the shunt 318A to the second track 314B, along a section of the second track 314B, and across the shunt 318B, returning to the first track 314A.

In an embodiment, alternating current transmitted from the vehicle 302 is injected into the route 304 at two or more points through the tracks 314 and received at different locations on the vehicle 302. For example, the first and second application devices 306A, 306B may be used to inject the first and second examination signals into respective first and second tracks 314A, 314B. One or more electrical characteristics in response to the injected examination signals may be received at the first and second detection units 316A, 316B. Each examination signal may have a unique identifier so the signals may be distinguished from each other at the detection units 316. For example, the unique identifier of the first examination signal may have a base frequency, a modulation, an embedded signature, and/or the like, that differs from the unique identifier of the second examination signal.

Figure 4:
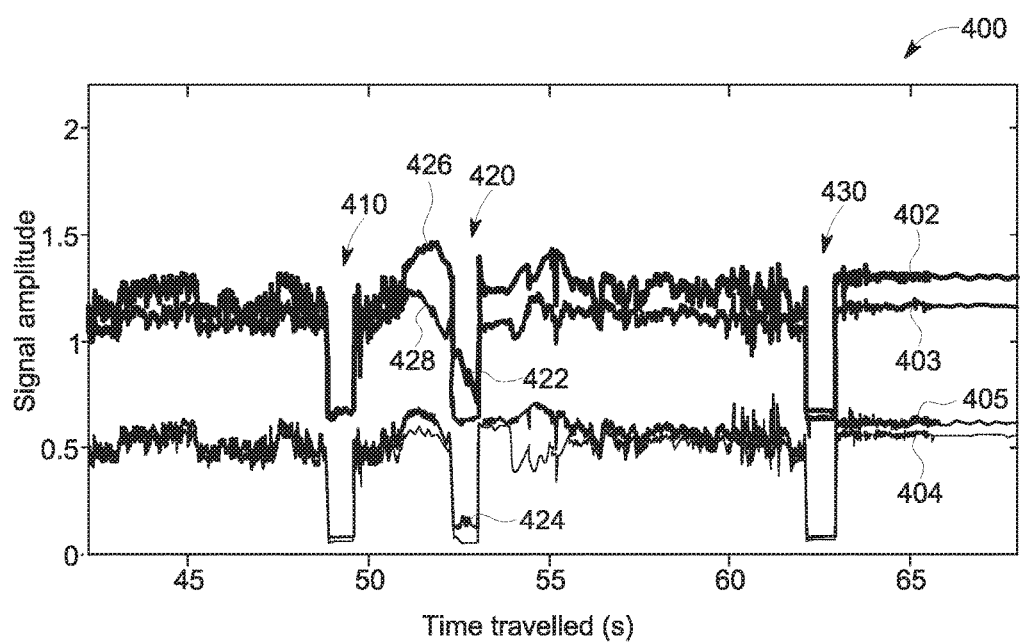
FIG. 4 depicts examination signals corresponding to a facing diverging move.
Figure 5:
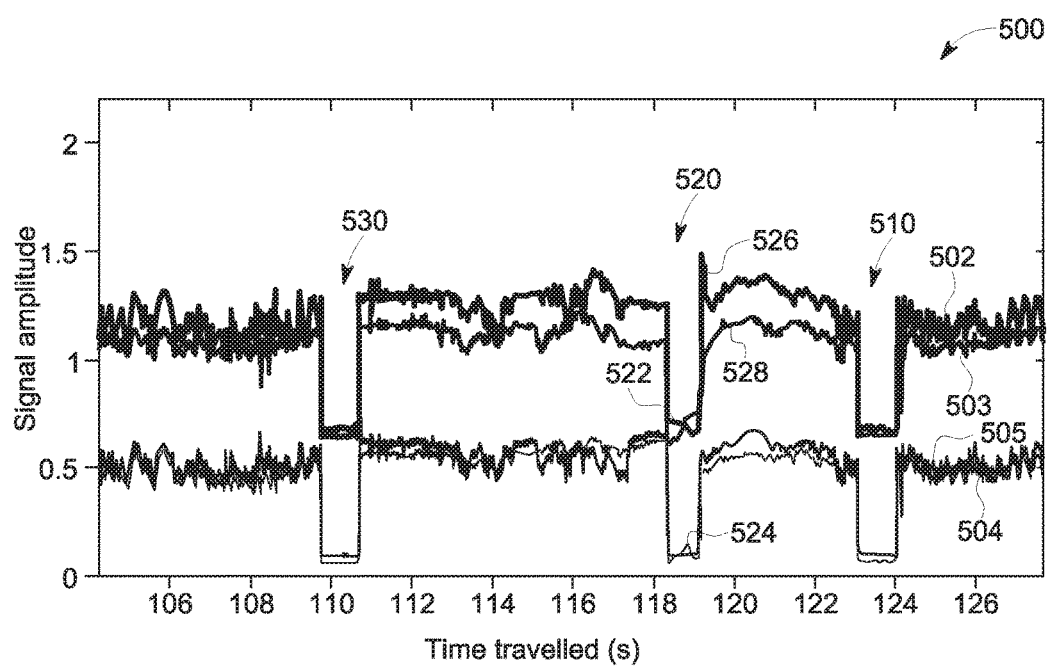
FIG. 5 depicts examination signals corresponding to a trailing diverging move.

FIG. 4 depicts examination signals corresponding to a facing diverging move (e.g., travel in the facing direction 101 through the switch 110 to the second track 114 via the path 106), and FIG. 5 depicts examination signals corresponding to a trailing diverging move (e.g., travel in the trailing direction 103 from the second track 114 to the first track 112 via the switch 110).

FIG. 4 depicts a signature 400 having four different signals corresponding to a vehicle traveling in a facing direction through a switch in a reverse (or diverging) position. The four signals include a first signal 402 collected at a first detector from a first transmitter at a first frequency, a second signal 403 collected at the first detector from a second transmitter at a second frequency, a third signal 404 collected at a second detector from the first transmitter at the first frequency, and a fourth signal 405 collected at the second detector from the second transmitter at the second frequency. The signature 400 is plotted as signal amplitude along a horizontal axis of time travelled. The time travelled may be converted to distance travelled using the speed of the vehicle. The first transmitter and first detector may be on a first side of the vehicle (e.g., left), and the second transmitter and the second detector may be on a different side of the vehicle (e.g., right).

As the vehicle travels through the switch and surrounding area, a first pulse 410, or sudden drop in amplitude, is experienced as the vehicle passes an insulated joint associated with a signal before the switch is encountered. After passing the signal, the pulse 410 terminates and the signal exhibits characteristics corresponding to an approach to the switch. A second pulse 420 corresponds to an insulated joint associated with the switch. For example, the second signal 403 includes a fairly steep drop 428 (followed by a short rise) immediately before the second pulse 420, and the first signal 402 includes a fairly steep rise 426 (followed by a relatively shorter drop) immediately before the second pulse 420. The drop 428 and the rise 426 may correspond to a particular attribute of a switch (e.g., a point rail, two adjacent rails at or near contact, two adjacent rails separated by a gap, or the like). The drop 428 and rise 426 are provided as examples only, as additional or alternate characteristics of the signals may also be identified in various embodiments. As the vehicle travels through and past the switch, the signature 400 includes a third pulse 430 corresponding to an insulated joint disposed past the switch along the facing direction. It may be noted that the distance between the third pulse 430 and the second pulse 420 is greater than the distance between the first pulse 410 and the second pulse 420. Thus, by observing the distances between the pulses, the order in which the pulses were encountered may be determined and used to determine a direction of travel of the vehicle, based, for example, on stored information describing the location of the signals relative to a given switch identified using the signature 400.

It may be noted that the signals may have generally similar characteristics during passage through the insulated joints of the signals (e.g., first pulse 410 and third pulse 430); however, the characteristics encountered during the second pulse 420 (associated with an insulated joint of the switch) differ from those of the pulses associated with signals. For example, the first signal 402 includes a drop 422 and the third signal 405 includes a characteristic 424 not seen in the first pulse 410 or third pulse 430. Thus, characteristics during a pulse as well as near a pulse may provide information regarding a feature that may be used to identify the type of feature (e.g., switch) as well as to distinguish the feature from other features of the same type but having different configurations (e.g., different sizes, diverging in different directions, or the like).

Generally, because the signals are sent and/or received from different sides of the vehicle, various characteristics of the four signals or relationships between the characteristics of the four signals may provide information regarding along which side of a route a particular attribute of a switch is encountered. Thus, a given signature (e.g., a collection of characteristics of the four signals over a span of time) may be associated not only with particular attributes of a switch (e.g., frog) but also associated with a side of the route along which those particular attributes are encountered. Thus, the signatures may provide or correspond to not only the size and type of feature, but also to direction of travel and configuration of feature. Thus, the various characteristics, as well as the order of characteristics, the identification of the particular signal in which a given characteristic is located, and/or the distance between characteristics may provide information that may be used to identify the type of construction feature as well as to differentiate between particular construction features. In some embodiments, a database of signatures associated with each feature (and, optionally, settings of some or all of the features and/or direction of travel) may be developed and used to identify features corresponding to signatures collected during travel along the route.

FIG. 5 depicts a signature 500 having four different signals corresponding to a vehicle traveling in a trailing direction through a switch in a reverse (or diverging) position. The switch and signals encountered in FIG. 5 thus may be similar to the switch and signals encountered in FIG. 4; however, the direction of travel is reversed in FIG. 5 relative to FIG. 4. The four signals include a first signal 502 collected at a first detector from a first transmitter at a first frequency, a second signal 503 collected at the first detector from a second transmitter at a second frequency, a third signal 504 collected at a second detector from the first transmitter at the first frequency, and a fourth signal 505 collected at the second detector from the second transmitter at the second frequency. The signature 500 is plotted as signal amplitude along a horizontal axis of time travelled. The time travelled may be converted to distance travelled using the speed of the vehicle. As discussed in connection with FIG. 4, the first transmitter and first detector may be on a first side of the vehicle (e.g., left), and the second transmitter and the second detector may be on a different side of the vehicle (e.g., right).

The first signature includes a first pulse 530 (corresponding to the same insulated joint associated with the third pulse 430), a second pulse 520 (corresponding to the same insulated joint associated with the second pulse 420), and a third pulse 510 (corresponding to the first pulse 410). The insulated joints in FIG. 5 are encountered in reverse order compared to FIG. 4. Generally similar to FIG. 4, in FIG. 5, the second pulse 520 (associated with an insulated joint of the switch) includes characteristics 522, 524 that differ from characteristics of the first pulse 530 and the third pulse 510.

Because the switch is the same switch in the same position (reverse or diverging), certain characteristics of the signature 500 may correspond at least loosely to certain characteristics of the signature 400. However, because the direction of travel is different, the order of the characteristics as well as the precise shape or configuration of the characteristics may vary.

For example, the first signal 502 includes a drop 526 after the vehicle passes the insulated joint associated with the second pulse 520 in the trailing direction that corresponds to the rise 426. Characteristic 526 is a drop instead of a rise due to the direction of travel. The precise shape of the characteristics are not true mirror images of each other in the illustrated embodiment, but, as seen in FIG. 5, exhibit a correlation or general similarity. Similarly, the second signal 503 includes a rise 528 that corresponds to the drop 426. The differences in these characteristics thus may help identify not only a feature encountered but a direction of travel as well. Additionally or alternatively, the distance between pulses of insulated joints may be used to determine direction of travel. For example, in FIG. 4, a shorter distance between pulses is encountered first followed by a longer distance, while, in FIG. 5, a longer distance between pulses is encountered first followed by a shorter distance, indicating the direction of travel is different for the two signatures 400, 500.

Each construction feature of a route may be studied (e.g., by performing test runs and collecting signatures) to provide a representative signature of the feature for each setting and direction of travel possible for the feature. The signature may also include distances between surrounding insulating joints of signals disposed on opposite sides of the feature. The representative signatures may be stored in a database and used to identify features for signatures encountered during performance of a mission (e.g., via comparison with the stored representative signatures to identify the most similar stored representative signature, or a most similar signature within a predetermined range of an estimated location).

Thus, the positioning of features (e.g., 426, 428, 526, 528) relative to an insulated joint, and the sequence of and/or distance between insulated joints (e.g., the order in which insulated joints are encountered determined, for example, based on distances between the insulated joints) may be used to not only identify a particular switch but also to identify a direction of travel and/or a setting of the switch.

Figure 6:
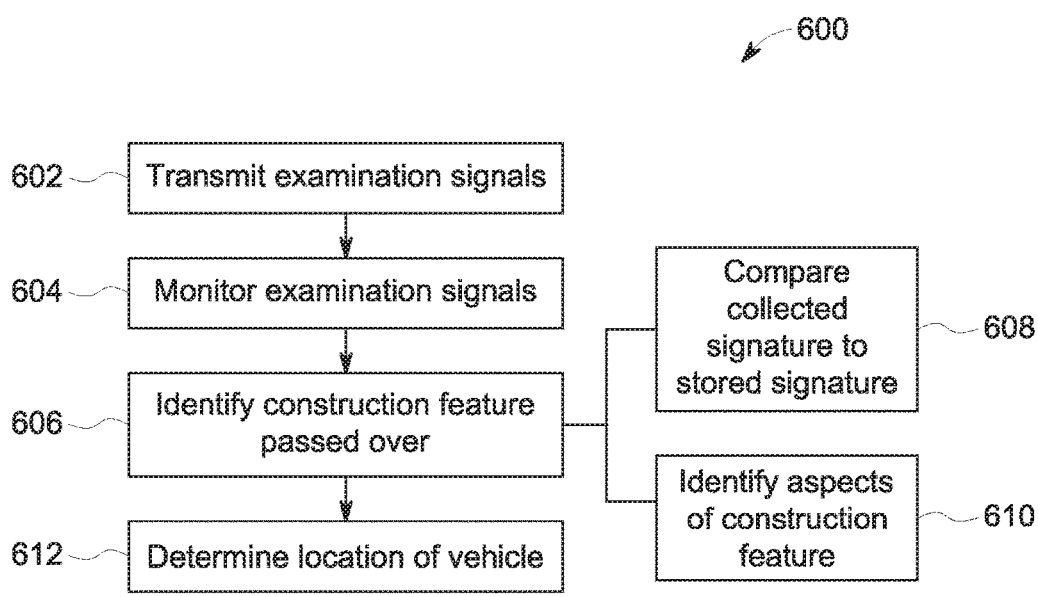
FIG. 6 is a flowchart of an embodiment of a method for identifying a construction feature of a route being traveled by a vehicle system from onboard the vehicle system.

FIG. 6 is a flowchart of a method 600 for identifying a construction feature encountered along a route in accordance with an example of the present inventive subject matter. The method 600, for example, may employ or be performed by structures or aspects of various embodiments (e.g., systems and/or methods and/or process flows) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 600 may be able to be used as one or more algorithms to direct hardware (e.g., one or more aspects of the processing unit 219) to perform one or more operations described herein.

At 602, examination signals are transmitted. For example, one or more transmitters disposed onboard a vehicle may inject examination signals into tracks of a route. In some embodiments, plural transmitters may be disposed on different sides of a vehicle and/or different points along length. For example, a first transmitter and a second transmitter, each transmitting at a distinct and recognizable frequency, may be disposed on different sides (e.g., left and right) of a vehicle. It may be noted that the transmitters may be disposed on the same vehicle within a vehicle system (e.g., consist) or on different vehicles within a vehicle system. The examination signals may be transmitted at regular intervals and/or in connection with construction features expected to be encountered based on a schedule or trip plan for the vehicle, and/or responsive to detection of an upcoming construction feature (e.g., detection of an insulated joint, reception of a message from a signal and/or switch, or the like).

At 604, the examination signals are monitored. For example, the examination signals that have been injected into the track at 602 may be detected via detection units communicably coupled to the track. Similar to the transmitters, plural detection units on different sides of a vehicle may be employed. In some embodiments, one or more detection units may be disposed on the same vehicle as one or more transmitters. In various embodiments, one or more detection units may be disposed on a different vehicle than one or more transmitters.

At 606, one or more construction features (bridge, switch, diamond crossing) passed over by the vehicle are identified. For example, a signature including characteristics of one or more examination signals may be compared to representative signatures for known construction features along the route to determine the feature passed over. Not only may a construction feature such as a switch by identified using the examination signals, but a setting of the switch (e.g., normal or reverse) as well as a direction of travel may be determined. In various embodiments, identifying one or more construction features may include one or more substeps, such as substeps 608 or 610.

At 608, a collected signature (e.g., one or more signals obtained via one or more detectors over a span of time as a vehicle passes by a given construction feature) is compared to stored signatures for each feature along a route. For example, a database of signatures for each feature of a route (as well as for each setting and/or direction of travel) may be examined to identify a signature most similar to a recently obtained signature.

At 610, individual characteristics are studied to identify corresponding attributes (e.g., point rail, frog) of the signature. For example, by identifying particular attributes of a signature, as well as the sequence of and distance between the attributes, the type of feature (e.g., switch, diamond crossing bridge) as well as, optionally, a setting of the feature (e.g., reverse and normal positions of a switch) and/or direction of travel may be determined. Further, by distinguishing between the distances between attributes of a switch, and/or and the position of attributes on different sides of a route, and/or the distance of signals (indicated by pulses caused by insulated joints associated with the signals) from the switch, individual switches may be distinguished between.

At 612, the location is determined. For example, the vehicle may have stored thereon or otherwise accessible to the vehicle a database or map indicating the location of each construction feature. Once a construction feature has been identified as being passed over, the location of the construction feature, the time elapsed since passing over the construction feature, and the speed of train may be used to determine the location of the vehicle. For increased reliability, multiple construction features may be identified and used to check or confirm a location determined using a single identified construction feature. In some embodiments, the location may describe or depict a location along a length of the route. Alternatively or additionally, the location may describe or depict a particular path among a plurality of paths upon which the vehicle is traveling. For example, by identifying a particular switch the vehicle has passed over (e.g., identifying the most recently passed over switch), as well as the setting of the switch and the direction of travel, the specific path upon which the vehicle is traveling may be determined based on the path resulting from passing over the switch in the specified direction with the switch at the specified setting.

In an embodiment, a system includes at least one application device, a control unit, and at least one processor. The at least one application device is configured to be at least one of conductively or inductively coupled with at least one of a first conductive track or a second conductive track of a route being traveled by a vehicle. The control unit is configured to control supply of electric current from a power source to the at least one application device to electrically inject at least one examination signal into the conductive tracks via the at least one application device. The at least one processor configured to be disposed onboard the vehicle. The at least one processor configured to monitor one or more electrical characteristics of at least one of the first or second conductive tracks in response to the at least one examination signal being injected into the conductive tracks, and to identify a construction feature of the route based on an examination of the one or more electrical characteristics, the construction feature corresponding to a man-made aspect of the route.

In one aspect, the at least one application device is configured to be disposed onboard the vehicle.

In one aspect, the at least one application device includes first and second application devices configured to be disposed onboard the vehicle, with the first and second application devices each configured to be at least one of conductively or inductively coupled with one or more of the conductive tracks. The control unit is configured to control supply of electric current from the power source to the first and second application devices in order to electrically inject a first examination signal of the at least one examination signal via the first application device into the one or more of the conductive tracks to which the first application device is coupled, and to electrically inject a second examination signal of the at least one examination signal via the second application device into the one or more of the conductive tracks to which the second application device is coupled. The system further includes first and second detection devices configured to be disposed onboard the vehicle on different sides of the vehicle.

In one aspect, the at least one processor is operably coupled to a database including locations correlated to construction features, and the at least one processor is configured to identify a location of the vehicle based on the construction feature that is identified as cross-referenced by the database.

In one aspect, the at least one processor is configured to identify a location of the vehicle along a length of the route.

In one aspect, the at least one processor is configured to identify a particular one of a group of at least two or more generally parallel paths upon which the vehicle system is traveling.

In one aspect, the construction feature includes a switch, and the at least one processor is configured to identify a direction of travel of the vehicle system and a setting of the switch based on the one or more electrical characteristics.

In one aspect, the construction feature includes at least one of a diamond crossing or a bridge.

In one aspect, the at least one processor is configured to identify the construction feature based upon a duration of the one or more electrical characteristics.

In another embodiment, a system includes a first application device, a second application device, a control unit, and at least one processor. The first application device and the second application device are configured to be at least one of conductively or inductively coupled with at least one of a first conductive track or a second conductive track of a route being traveled by a vehicle. The control unit is configured to control supply of electric current from a power source to the first and second application devices to electrically inject a first examination signal via the first application device and a second examination signal via the second application device into the conductive tracks. The first and second examination signals include respective unique identifiers. The at least one processor is configured to be disposed onboard the vehicle. The at least one processor is configured to monitor one or more electrical characteristics of at least one of the first or second conductive tracks in response to the first and second examination signals being injected into the conductive tracks; to identify a construction feature of the route based on an examination of the one or more electrical characteristics, wherein the construction feature corresponding to at least one of a switch, a diamond crossing, or a bridge; to determine a location of the vehicle based on the construction feature; and to control at least one device onboard the vehicle based on the location that is determined.

In another embodiment, a method includes injecting, via at least one application device disposed upon a vehicle, at least one examination signal into at least one of first or second conductive tracks of a route being traveled by the vehicle. The method also includes monitoring, via at least one detection device disposed upon the vehicle, one or more electrical characteristics of at least one of the first or second conductive tracks in response to the at least one examination signal being injected into the at least one of the first or second conductive tracks. Also, the method includes identifying a construction feature of the route based on the one or more electrical characteristics.

In one aspect, injecting the at least one examination signal includes electrically injecting first and second examination signals into the first and second conductive tracks of the route being traveled by the vehicle, with the first and second examination signals being injected at spaced apart locations along a length of the vehicle. Also, in one aspect, monitoring the one or more electrical characteristics of at least one of the first or second conductive tracks includes monitoring the first and second conductive tracks at first and second monitoring locations disposed onboard the vehicle in response to the first and second examination signals being injected into the conductive tracks.

In one aspect, the first examination signal is injected into the first conductive track and the second examination signal is injected into the second conductive track.

In one aspect, the first and second examination signals include respective unique identifiers configured to allow for distinguishing the first examination signal from the second examination signal in the one or more electrical characteristics of the conductive tracks.

In one aspect, identifying the construction feature includes identifying a switch.

In one aspect, identifying the switch includes identifying a direction of travel through the switch based on the one or more electrical characteristics.

In one aspect, identifying the switch includes identifying a setting of the switch based on the one or more electrical characteristics.

In one aspect, the method includes identifying a location of the vehicle based on the construction feature identified.

In one aspect, identifying the location includes identifying a position of the vehicle along a length of the route based on the one or more electrical characteristics.

In one aspect, identifying the location includes identifying a particular one of a group of at least two or more generally parallel paths upon which the vehicle is traveling based on the one or more electrical characteristics.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended clauses, along with the full scope of equivalents to which such clauses are entitled. In the appended clauses, the terms "including" and "in which" are used as the plain-English equivalents of the respective terms "comprising" and "wherein." Moreover, in the following clauses, the terms "first," "second," and "third," etc. are used merely as labels, and are not intended to impose numerical requirements on their objects. Further, the limitations of the following clauses are not written in means-plus-function format and are not intended to be interpreted based on 35 U.S.C. §112(f), unless and until such clause limitations expressly use the phrase "means for" followed by a statement of function void of further structure.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter may include other examples that occur to those of ordinary skill in the art. Such other examples are intended to be within the scope of the clauses if they have structural elements that do not differ from the literal language of the clauses, or if they include equivalent structural elements with insubstantial differences from the literal languages of the clauses.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "an embodiment" or "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described systems and methods without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

What is claimed is:

1. A system comprising:
    at least one application device configured to be at least one of conductively or inductively coupled with at least one conductive rail of a route being traveled by a vehicle, wherein the at least one application device is configured to be disposed onboard the vehicle;
    a control unit configured to control supply of electric current from a power source to the at least one application device to electrically inject at least one examination signal into the at least one conductive rail via the at least one application device; and
    at least one processor configured to be disposed onboard the vehicle, the at least one processor configured to:
    monitor one or more electrical characteristics of the at least one conductive rail in response to the at least one examination signal being injected into the at least one conductive rail;
    identify a construction feature of the route based on one or more of a shape of a waveform of the one or more electrical characteristics, a strength of a signal of the one or more electrical characteristics, or a duration of at least a portion of the one or more electrical characteristics, the construction feature corresponding to a man-made aspect of the route; and
    identify a direction of travel of the vehicle and a setting of the construction feature based on the one or more electrical characteristics.

2. The system of claim 1, wherein:
    the at least one application device comprises first and second application devices configured to be disposed onboard the vehicle, the first and second application devices each configured to be at least one of conductively or inductively coupled with one or more of the at least one conductive rail;
    the control unit is configured to control supply of electric current from the power source to the first and second application devices in order to electrically inject a first examination signal of the at least one examination signal via the first application device into the one or more of the at least one conductive rail to which the first application device is coupled and to electrically inject a second examination signal of the at least one examination signal via the second application device into the one or more of the at least one conductive rail to which the second application device is coupled; and
    the system further comprises first and second detection devices configured to be disposed onboard the vehicle on different sides of the vehicle.

3. The system of claim 1, wherein the at least one processor is operably coupled to a database including locations correlated to construction features, and wherein the at least one processor is configured to identify a location of the vehicle based on the construction feature that is identified as cross-referenced by the database.

4. The system of claim 3, wherein the at least one processor is configured to identify a location of the vehicle along a length of the route.

5. The system of claim 3, wherein the at least one processor is configured to identify a particular one of a group of at least two or more generally parallel paths upon which the vehicle is traveling.

6. A system comprising:
    at least one application device configured to be at least one of conductively or inductively coupled with at least one conductive rail of a route being traveled by a vehicle, wherein the at least one application device is configured to be disposed onboard the vehicle;
    a control unit configured to control supply of electric current from a power source to the at least one application device to electrically inject at least one examination signal into the at least one conductive rail via the at least one application device; and
    at least one processor configured to be disposed onboard the vehicle, the at least one processor configured to:
    monitor one or more electrical characteristics of the at least one conductive rail in response to the at least one examination signal being injected into the at least one conductive rail;
    identify plural construction features of the route based on one or more of a shape of a waveform of the one or more electrical characteristics, a strength of a signal of the one or more electrical characteristics, or a duration of at least a portion of the one or more electrical characteristics, the construction features corresponding to man-made aspects of the route; and
    identify a location of vehicle along the route and a track on which the vehicle is traveling, from among plural tracks that include the track on which the vehicle is traveling and one or more other, parallel, adjacent tracks, based on at least one of a sequence or a time of encountering the plural construction features that are identified.

7. A system comprising:
    at least one application device configured to be at least one of conductively or inductively coupled with at least one conductive rail of a route being traveled by a vehicle, wherein the at least one application device is configured to be disposed onboard the vehicle;
    a control unit configured to control supply of electric current from a power source to the at least one application device to electrically inject at least one examination signal into the at least one conductive rail via the at least one application device; and
    at least one processor configured to be disposed onboard the vehicle, the at least one processor configured to
    monitor one or more electrical characteristics of the at least one conductive rail in response to the at least one examination signal being injected into the at least one conductive rail;
    identify a construction feature of the route based on one or more of a shape of a waveform of the one or more electrical characteristics, a strength of a signal of the one or more electrical characteristics, or a duration of at least a portion of the one or more electrical characteristics, wherein the construction feature corresponds to at least one of a switch, a diamond crossing, or a bridge;

determine a location of the vehicle based on the construction feature; and control at least one device onboard the vehicle based on the location that is determined.

8. The system of claim 7, wherein:

the at least one application device comprises first and second application devices configured to be disposed onboard the vehicle, the first and second application devices each configured to be at least one of conductively or inductively coupled with one or more of the at least one conductive rail;

the control unit is configured to control supply of electric current from the power source to the first and second application devices in order to electrically inject a first examination signal of the at least one examination signal via the first application device into the one or more of the at least one conductive rail to which the first application device is coupled and to electrically inject a second examination signal of the at least one examination signal via the second application device into the one or more of the at least one conductive rail to which the second application device is coupled; and the system further comprises first and second detection devices configured to be disposed onboard the vehicle on different sides of the vehicle.

9. The system of claim 7, wherein the at least one processor is operably coupled to a database including locations correlated to construction features, and wherein the at least one processor is configured to identify the location of the vehicle based on the construction feature that is identified as cross-referenced by the database.

10. The system of claim 9, wherein the at least one processor is configured to identify the location of the vehicle along a length of the route.

11. The system of claim 9, wherein the at least one processor is configured to identify a particular one of a group of at least two or more generally parallel paths upon which the vehicle is traveling.

12. A system comprising:

at least one application device configured to be at least one of conductively or inductively coupled with at least one of a first conductive track or a second conductive track of a route being traveled by a vehicle, wherein the at least one application device is configured to be disposed onboard the vehicle;

a control unit configured to control supply of electric current from a power source to the at least one application device to electrically inject at least one examination signal into the conductive tracks via the at least one application device;

at least one processor configured to be disposed onboard the vehicle, the at least one processor configured to monitor one or more electrical characteristics of at least one of the first or second conductive tracks in response to the at least one examination signal being injected into the conductive tracks; and identify a construction feature of the route based on one or more of a shape of a waveform of the one or more electrical characteristics, a strength of a signal of the one or more electrical characteristics, or a duration of at least a portion of the one or more electrical characteristics, wherein the construction feature comprises at least one of a diamond crossing or a bridge.

13. The system of claim 12, wherein:

the at least one application device comprises first and second application devices configured to be disposed onboard the vehicle, the first and second application devices each configured to be at least one of conductively or inductively coupled with one or more of the conductive tracks;

the control unit is configured to control supply of electric current from the power source to the first and second application devices in order to electrically inject a first examination signal of the at least one examination signal via the first application device into the one or more of the conductive tracks to which the first application device is coupled and to electrically inject a second examination signal of the at least one examination signal via the second application device into the one or more of the conductive tracks to which the second application device is coupled; and the system further comprises first and second detection devices configured to be disposed onboard the vehicle on different sides of the vehicle.

14. The system of claim 12, wherein the at least one processor is operably coupled to a database including locations correlated to construction features, and wherein the at least one processor is configured to identify a location of the vehicle based on the construction feature that is identified as cross-referenced by the database.

* * * * *